United States Patent
Hsu

(10) Patent No.: US 7,449,363 B2
(45) Date of Patent: Nov. 11, 2008

(54) SEMICONDUCTOR PACKAGE SUBSTRATE WITH EMBEDDED CHIP AND FABRICATION METHOD THEREOF

(75) Inventor: Shih-Ping Hsu, Hsin-chu (TW)

(73) Assignee: Phoenix Precision Technology Corporation, Hsin-chu (TW)

( * ) Notice: Subject to any disclaimer, the term of this patent is extended or adjusted under 35 U.S.C. 154(b) by 330 days.

(21) Appl. No.: 11/131,408

(22) Filed: May 18, 2005

(65) Prior Publication Data

US 2006/0115931 A1    Jun. 1, 2006

(30) Foreign Application Priority Data

Nov. 26, 2004    (TW) .............................. 93136437 A

(51) Int. Cl.
*H01L 21/50* (2006.01)
*H01L 21/48* (2006.01)
*H01L 21/44* (2006.01)
*H01L 23/12* (2006.01)
*H01L 23/02* (2006.01)
*H01L 23/24* (2006.01)

(52) U.S. Cl. ...................... 438/106; 438/118; 438/119; 438/121; 257/711; 257/687; 257/685

(58) Field of Classification Search ................ 438/106, 438/118, 119, 121; 257/711, 687, 685
See application file for complete search history.

(56) References Cited

U.S. PATENT DOCUMENTS

| | | | |
|---|---|---|---|
| 5,432,677 A * | 7/1995 | Mowatt et al. | 361/719 |
| 6,423,570 B1 * | 7/2002 | Ma et al. | 438/106 |
| 6,538,210 B2 * | 3/2003 | Sugaya et al. | 174/258 |
| 6,555,908 B1 * | 4/2003 | Eichelberger et al. | 257/737 |
| 6,746,898 B2 * | 6/2004 | Lin et al. | 438/113 |
| 6,865,089 B2 * | 3/2005 | Ho et al. | 361/761 |
| 7,045,391 B2 * | 5/2006 | Lin | 438/109 |
| 7,067,356 B2 * | 6/2006 | Towle et al. | 438/122 |
| 7,180,099 B2 * | 2/2007 | Ogihara et al. | 257/99 |

* cited by examiner

*Primary Examiner*—Luan Thai
(74) *Attorney, Agent, or Firm*—Clark & Brody

(57) ABSTRACT

A semiconductor package substrate with embedded chip and a fabrication method thereof are provided. A first insulating layer is applied on a metallic board, and formed with at least one opening for exposing a portion of the metallic board. At least one semiconductor chip is mounted on the exposed portion of the metallic board. A support plate is mounted on the first insulating layer, and formed with a through cavity at a position corresponding to the opening of the first insulating layer, for receiving the chip in the through cavity. A second insulating layer is applied on the chip and the support plate. Insulating materials of the insulating layers fill a gap between the chip and the support plate. A circuit layer is formed on the second insulating layer, wherein the circuit layer is electrically connected to the chip by conductive structures formed in the second insulating layer.

17 Claims, 3 Drawing Sheets

SEMICONDUCTOR PACKAGE SUBSTRATE WITH EMBEDDED CHIP AND FABRICATION METHOD THEREOF

FIELD OF THE INVENTION

The present invention relates to semiconductor package substrates with embedded chips and fabrication methods thereof, and more particularly, to a semiconductor package substrate integrated with a heat sink, a semiconductor chip and a circuit structure, and a fabrication method of the semiconductor package substrate.

BACKGROUND OF THE INVENTION

Flip-chip semiconductor packaging technology has been introduced in early 1960s by the IBM company, which is characterized in using solder bumps for electrically connecting a semiconductor chip to a substrate instead of using general gold wires as compared with wire-bonding technology. The flip-chip technology yields significant advantages, for example increasing packaging density to reduce the size of package element, and improving electrical performance as not requiring relatively lengthy metallic wires. Accordingly, there has been proposed control-collapse chip connection (C4) technology to use high temperature solder on a ceramic substrate. Recently due to increase in high-density, high-speed and low-cost requirements for semiconductor elements, and in response to gradual reduction of volume of electronic products, it is greatly developed to mount a flip-chip element (such as a silicon chip) on a low-cost organic circuit board (such as a printed circuit board or substrate) and fill a gap between the silicon chip and the organic circuit board with underfill epoxy resin so as to reduce thermal stresses produced by mismatch in thermal expansion between the silicon chip and the organic circuit board.

In the current flip-chip technology, a plurality of electrode pads are formed on a surface of a semiconductor IC (integrated circuit) chip, and corresponding contact pads are formed on an organic circuit board, such that solder bumps or other conductive adhesive materials can be adequately disposed between the chip and the circuit board. The chip is mounted on the circuit board in a face-down manner that an active surface of the chip faces the circuit board. The solder bumps or other conductive adhesive materials provide electrical input/output (I/O) connection and mechanical connection between the chip and the circuit board.

FIG. 1 shows a conventional flip-chip element. As shown in FIG. 1, a plurality of metallic bumps 11 are formed on electrode pads 12 of a chip 13, and a plurality of pre-solder bumps 14 made of a solder material are formed on contact pads 15 of an organic circuit board 16. Under a reflow temperature sufficient to make the re-solder bumps 14 melt, the re-solder bumps 14 are reflowed to the corresponding metallic bumps 11 to form solder joints 17. Further in the fabrication processes, a gap between the chip 13 and the circuit board 16 can be filled with an underfill resin material 18, so as to reduce mismatch in thermal expansion between the chip 13 and the circuit board 16 and decrease stresses for the solder joints 17.

However, the foregoing package fabrication processes uses a large amount of Sn—Pb materials for electrical connection. The Sn—Pb materials have relatively high costs, making fabrication costs increased and causing an environmental problem due to the materials containing Pb. Moreover, an electrical connection path of conductive circuits is relatively lengthy in the above package, thereby not able to improve overall electrical performance.

In light of the above problem, there has been developed a new semiconductor packaging technique named "bumpless build-up lamination (BBUL)" technique. The BBUL technique does not use solder bumps, but employs copper connections for electrically connecting the chip to various layers of the package structure in a high-speed manner.

Although the BBUL technique can solve the problem of chip electrical connection, in BBUL packaging processes due to mismatch in coefficient of thermal expansion (CTE) between a semiconductor material (such as a chip) and a receiving base material, breakage or cracks of layout circuits may be caused. As a result, an additional underfilling process is required to fill an encapsulating resin in a gap between the chip and the receiving base material. However, the underfilling process not only increase fabrication steps but also easily leads to a problem such as flashes due to difficulty in control quality stability in fabrication; the flashes would contaminate the chip and thus adversely affect reliability of the fabrication processes. Moreover, the encapsulating resin is different in material from a subsequent insulating layer required for circuit stacking, such that the underfilling process not only increase the fabrication steps but also easily causes a delamination problem. In addition, during resin underfilling, due to the size of the gap between the chip and the base material, the encapsulating resin is not easy to effectively fill the small gap and thus causes voids in the gap, which would lead to a popcorn effect during a thermal cycle of a subsequent circuit stacking process and a subsequent reliability test. This makes the quality stability of the BBUL package unsatisfactory and difficult to control, thereby not able to be widely accepted.

Furthermore, along with advanced development of electronic industries, electronic products are accordingly made with multiple functions and high performances. In order to achieve the high integration and miniaturization requirements of semiconductor packages, heat produced by operation of semiconductor chips would be greatly increased. If the heat produced from the requirements of semiconductor packages, heat produced by operation of semiconductor chips cannot be timely and effectively dissipated, the performances and lifetime of the semiconductor chips would be severely affected. Additionally, general semiconductor packages do not have effective shielding effects, which may be easily subject to external electromagnetic and noise interference and thus operation thereof would be adversely affected.

SUMMARY OF THE INVENTION

In light of the above drawbacks in the prior art, an objective of the present invention is to provide a semiconductor package substrate with embedded chip and a fabrication method thereof, which can integrate fabrication processes of a chip support plate and semiconductor packaging processes, so as to provide greater flexibility for clients' requirements and simplify semiconductor fabrication processes and an interface integration problem.

Another objective of the present invention is to provide a semiconductor package substrate with embedded chip and a fabrication method thereof, so as to effectively dissipate heat produced by operation of a semiconductor-chip.

Still another objective of the present invention is to provide a semiconductor package substrate with embedded chip and a fabrication method thereof, which can prevent problems such as flashes during an encapsulation process, failure in effective filling and so on in packaging processes for a chip and a receiving base material in the prior art, so as to effectively improve production quality and product reliability.

A further objective of the present invention is to provide a semiconductor package substrate with embedded chip and a fabrication method thereof, by which an insulating layer is used to fix a semiconductor chip and as a material for a circuit patterning process, so as to save materials and reduce fabrication costs.

In accordance with the above and other objectives, the present invention proposes a fabrication method of a semiconductor package substrate with embedded chip, comprising the steps of: applying a first insulating layer on a surface of a metallic board, wherein the first insulating layer is formed with at least one opening for exposing a portion of the metallic board; providing at least one semiconductor chip having a plurality of electrode pads on an active surface thereof, and mounting a non-active surface of the semiconductor chip on the portion of the metallic board exposed via the opening of the first insulating layer; mounting a support plate on the first insulating layer, wherein the support plate is formed with a through cavity at a position corresponding to the opening of the first insulating layer, for receiving the semiconductor chip in the through cavity; applying a second insulating layer on the semiconductor chip and the support plate, and allowing insulating materials of the first and second insulating layers to fill a gap between the semiconductor chip and the support plate by a heating pressing process; performing a circuit patterning process to form a plurality of openings in the second insulating layer applied on the semiconductor chip and the support plate, for exposing the electrode pads of the semiconductor chip; forming a conductive layer on the second insulating layer and the exposed electrode pads, and performing an electroplating process after a patterned resist layer is formed on the conductive layer so as to form a circuit layer and conductive structures on the conductive layer, such that the circuit layer is electrically connected to the electrode pads of the semiconductor chip by the conductive structures; and removing the resist layer and the conductive layer covered by the resist layer. Subsequently, a build-up process can be performed to fabricate more circuit layers. Further, conductive elements can be provided on an outer circuit layer, for electrically connecting the semiconductor chip embedded in the semiconductor package substrate to an external electronic device.

By the foregoing fabrication method, a semiconductor package substrate with embedded chip proposed in the present invention comprises a metallic board; a first insulating layer formed with at least one opening and applied on the metallic board; a support plate formed with a through cavity and mounted on the first insulating layer; wherein the through cavity of the support plate is formed at a position corresponding to the opening of the first insulating layer; at least one semiconductor chip having a plurality of electrode pads, the semiconductor chip being mounted on the metallic board and received in the opening of the first insulating layer and the through cavity of the support plate; a second insulating layer applied on the semiconductor chip and the support plate, allowing insulating materials of the first and second insulating layers to fill a gap between the semiconductor chip and the support plate; and at least one circuit layer formed on the second insulating layer, and electrically connected to the electrode pads of the semiconductor chip by a plurality of conductive structures, and the semiconductor chip can be electrically connected to an external electronic device by conductive elements provided on an outer surface of the circuit layer.

Therefore, the present invention can combine fabrication processes of a chip carrier and semiconductor packaging processes by integrating the metallic layer, the semiconductor chip and a circuit structure, so as to provide greater flexibility for clients' requirements and simplify semiconductor fabrication processes and an interface integration problem. Further in the present invention, the semiconductor chip is mounted on the metallic board, for providing good heat dissipating and electromagnetic shielding effects. Moreover, the present invention does not use a large amount of Sn—Pb materials for electrical connection, thereby saving material costs and preventing an environmental problem. And in the present invention, copper circuits are directly formed on the semiconductor chip, for providing electrical connection and extension, so as to shorten an electrical connection path and effectively improve overall electrical performances. Furthermore, in the present invention, a first insulating layer that has not been completely cured and the semiconductor chip are firstly mounted on the metallic board, and then a support plate having a predetermined through cavity for receiving the semiconductor chip is mounted on the first insulating layer and a second insulating layer is pressed on the support plate by heating, so as to allow insulating materials of the first and second insulating layers to fill a gap between the semiconductor chip and the support plate, and effectively fix the semiconductor chip in the through cavity of the support plate. The second insulating layer also serves as a material required for a subsequent circuit fabrication process, such that material costs are saved, and a reliability problem due to chip contamination by flashes during an encapsulation process in conventional semiconductor packaging processes can be prevented, as well as a process stability problem such as a popcorn effect in a thermal cycle of a subsequent circuit stacking process caused by difficulty in effectively filling the gap between the semiconductor chip and the support plate by an encapsulating resin can be prevented.

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

FIGS. 2A to 2J are cross-sectional schematic diagrams showing steps of a fabrication method of a semiconductor package substrate with embedded chip according to the present invention.

Figure 1:
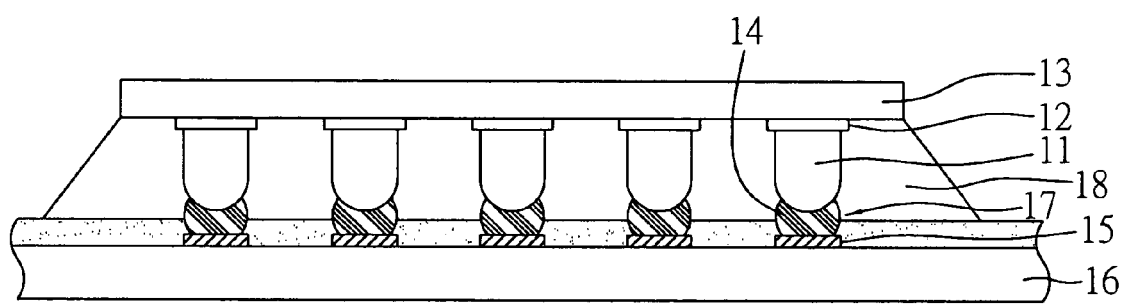
FIG. 1 (PRIOR ART) is a cross-sectional view of a conventional flip-chip ball grid array (FCBGA) semiconductor package.
Figure 2A:
FIGS. 2A to 2J are cross-sectional schematic diagrams showing steps of a fabrication method of a semiconductor package substrate with embedded chip according to the present invention.

Referring to FIG. 2A, firstly a metallic board 20 is provided, and a first insulating layer 21 is applied on a surface of the metallic board 20, wherein the first insulating layer 21 applied on the metallic board has not been completely cured by baking and is formed with at least one opening 210 for exposing a portion of the metallic board 20. The metallic board 20 can be made of for example a copper foil. The first insulating layer 21 can be made of a material such as polyimide (PI), polytetrafluoroethylene (PTFE), ABF, bismaleimide triazine (BT), FR5 resin, or a mixture of organic resin and fillers, and so on.

Figure 2B:
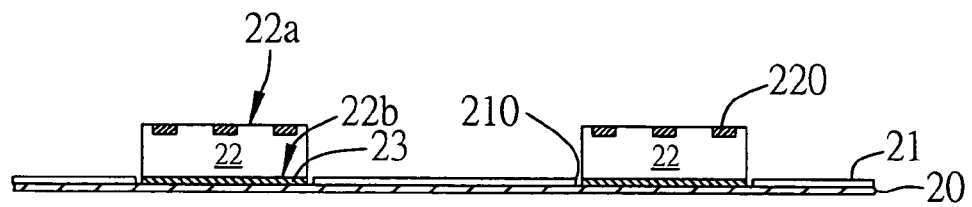

Referring to FIG. 2B, a non-active surface 22b of at least one semiconductor chip 22 is mounted by a thermally conductive adhesive layer 23 on the portion of the metallic board 20 exposed via the opening 210 of the first insulating layer 21. An active surface 22a of the semiconductor chip 22 has a plurality of electrode pads 220. Heat produced by operation of the semiconductor chip 22 can be directly dissipated by a thermally conductive path composed of the thermally conductive adhesive layer 23 and the metallic board 20, and the metallic board 20 can provide an electromagnetic shielding effect for the semiconductor chip 22.

Figure 2C:
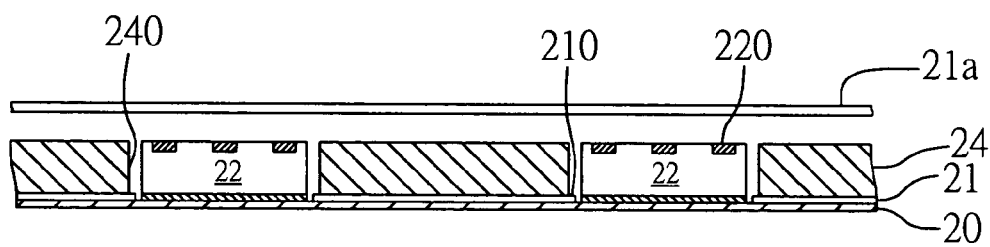

Referring to FIG. 2C, a support plate 24 is mounted on the first insulating layer 21, and is formed with a through cavity 240 at a position corresponding to the opening 210 of the first insulating layer 21, for receiving the semiconductor chip 22 in the through cavity 240. The through cavity 240 of the support plate 24 is preferably larger than the opening 210 of the first insulating layer 21 on the metallic board 20, such that with the support plate 24 being mounted on the first insulating layer 21, subsequently the first insulating layer 21 can effectively fill a gap between the semiconductor chip 22 and the support plate 24. Moreover, a second insulating layer 21a is provided. The second insulating layer 21a can be made of a material such as polyimide (PI), polytetrafluoroethylene (PTFE), ABF, bismaleimide triazine (BT), FR5 resin, or a mixture of organic resin and fillers, and so on, which can be same as or different from the material of the first insulating layer 21 on the metallic board 20. The support plate 24 can be a circuit board, an insulating plate, or a metallic plate. The metallic plate can be made of copper; the insulating plat can be made of a material such as epoxy resin, polyimide, cyanate ester, glass fiber, bismaleimide triazine (BT), or a mixture of glass fiber and epoxy resin, and so on; the circuit board can be a pre-treated circuit board with a circuit layer.

Figure 2D:
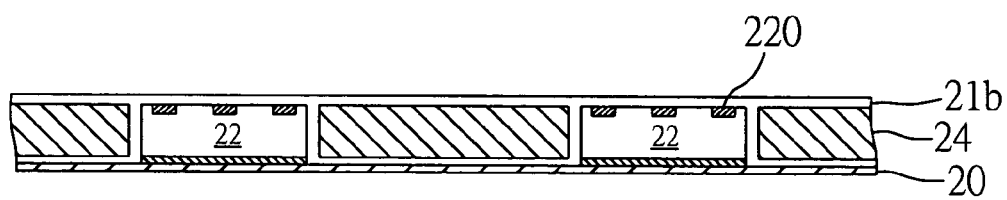

Referring to FIG. 2D, a heating pressing process is performed to press the second insulating layer 21a on the support plate 24 and the active surface 22a of the semiconductor chip 22, so as to allow an insulating material of the second insulating layer 21a pressed on the support plate 24 and the semiconductor chip 22 to flow and fill a gap between the semiconductor chip 2 and the support plate 24 together with an insulating material of the first insulating layer 21 so as to form an encapsulation insulating layer 21b that completely encapsulates the semiconductor chip 22.

Figure 2E:
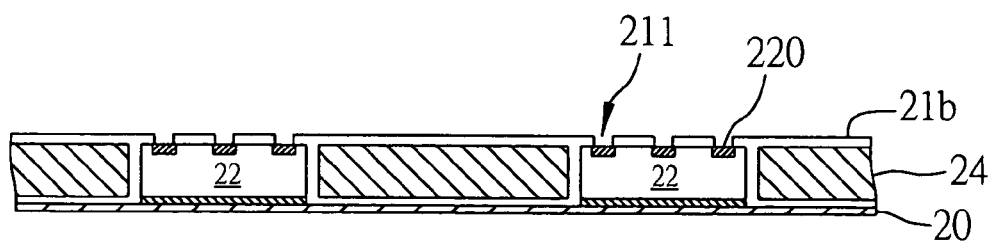

Referring to FIG. 2E, a plurality of openings 211 are formed on a surface of the encapsulation insulating layer 21b by for example laser drilling or exposure and development, so as to expose the electrode pads 220 of the semiconductor chip 22 via the openings 211.

Figure 2F:
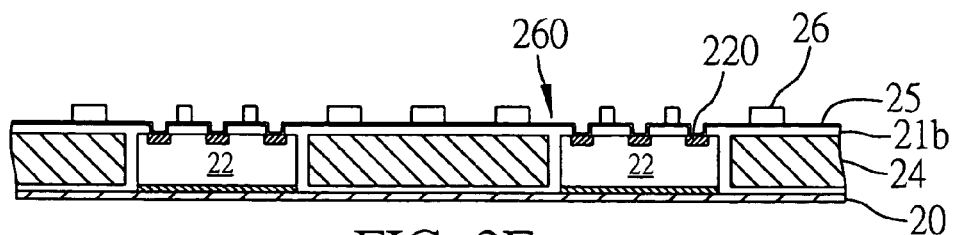

Referring to FIG. 2F, a conductive layer 25 is formed on the encapsulation insulating layer 21b and the electrode pads 220 exposed via the openings 211. A resist layer 26 is applied on the conductive layer 25, and is formed with a plurality of openings 260 for exposing portions of the conductive layer 25, wherein a part of the openings 260 of the resist layer 26 corresponds to the openings 211 of the encapsulation insulating layer 21b. The conductive layer 25 serves as a current conductive path required for subsequently electroplating a metallic layer. The conductive layer 25 can be made of metal or a conductive polymer material.

Figure 2G:
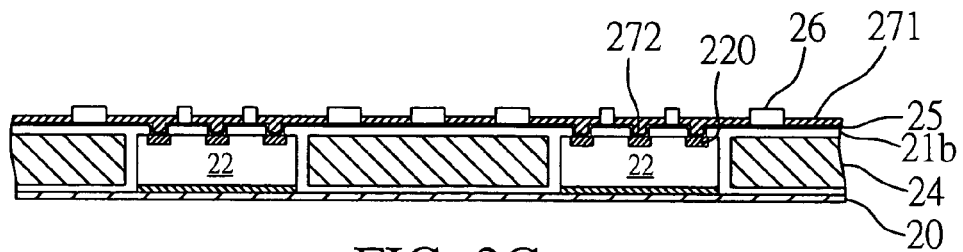

Referring to FIG. 2G, an electroplating process is performed to form a circuit layer 271 and conductive structures 272 on the portions of the conductive layer 25 exposed via the openings 260 of the resist layer 26, such that the circuit layer 271 on the encapsulation insulating layer 21b can be electrically connected to the electrode pads 220 of the semiconductor chip 22 by the conductive structures 272 formed in the encapsulation insulating layer 21b, thereby providing external electrical extension for the semiconductor chip 22. It should be noted that if the support plate 24 is made of a metallic material, it can serve as a grounding member; or if the support plate 24 is a circuit board preformed with circuits, during the foregoing circuit patterning process, the circuit layer 271 can be electrically connected to the support plate 24 by a plurality of conductive structures (not shown), thereby providing better electrical performances for the semiconductor device. The conductive structures 272 can be conductive vias or conductive bumps, etc.

Figure 2H:
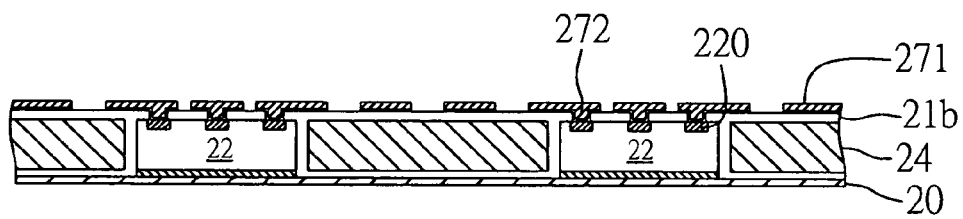

Referring to FIG. 2H, the resist layer 26 and the conductive layer 25 covered by the resist layer 26 are removed.

Figure 2I:
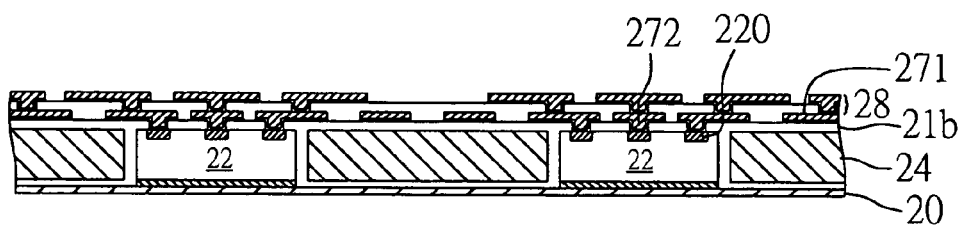

Referring to FIG. 2I, a circuit build-up process can be continued to form a circuit build-up structure 28 on the semiconductor chip 22 and the support plate 24, and the circuit build-up structure 28 is electrically connected to the electrode pads 220 of the semiconductor chip 22.

Figure 2J:
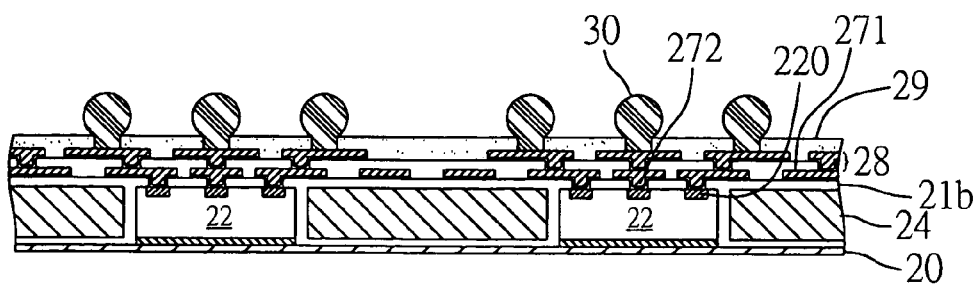

Referring to FIG. 2J, a solder mask layer 29 can be applied on an outer surface of the circuit build-up structure 28, and is formed with a plurality of openings for exposing portions of the outer surface of the circuit build-up structure 28, such that a plurality of conductive elements 30 such as solder balls or conductive posts are formed on the outer surface of the circuit build-up structure 28, so as to allow the semiconductor package substrate to be electrically connected to an external electronic device.

A semiconductor package substrate with embedded chip obtained by the foregoing fabrication method in the present invention comprises a metallic board 20; a first insulating layer 21 formed with at least one opening 210 and applied on the metallic board 20; a support plate 24 formed with a through cavity 240 and mounted on the first insulating layer 21, wherein the through cavity 240 of the support plate 24 is formed at a position corresponding to the opening 210 of the first insulating layer 21; at least one semiconductor chip 22 having a plurality of electrode pads 220, the semiconductor chip 22 being mounted on the metallic board 20 and received in the opening 210 of the first insulating layer 21 and the through cavity 240 of the support plate 24; a second insulating layer 21a pressed on the semiconductor chip 22 and the support plate 24, allowing the second insulating layer 21a to fill a gap between the semiconductor chip 22 and the support plate 24; and at least one circuit layer 271 formed on the second insulating layer 21a, and electrically connected to the electrode pads 220 of the semiconductor chip 22 by a plurality of conductive structures 272 formed in the second insulating layer 21a. A circuit build-up structure 28 can be formed for electrically connecting the semiconductor chip 22 to an external electronic device by a plurality of conductive elements 30.

Therefore, the semiconductor package substrate with embedded chip and the fabrication method thereof in the present invention can combine fabrication processes of a chip carrier and semiconductor packaging processes by integrating the metallic board, the semiconductor chip and a circuit structure, so as to provide greater flexibility for clients' requirements and simplify semiconductor fabrication processes and an interface integration problem. Further in the present invention, the semiconductor chip is mounted on the metallic board for providing good heat dissipating and electromagnetic shielding effects. Moreover, the present invention does not use a large amount of Sn—Pb materials for electrical connection, thereby saving material costs and preventing an environmental problem. And in the present invention, copper circuits are directly formed on the semiconductor chip, for providing electrical connection and extension, so as to shorten an electrical connection path and effectively improve overall electrical performances. Furthermore, in the present invention, a first insulating layer that has not been completely cured and the semiconductor chip are firstly mounted on the metallic board, and then a support plate having a predetermined through cavity for receiving the semiconductor chip is mounted on the first insulating layer and a second insulating layer is pressed on the support plate by heating, so as to allow insulating materials of the first and second insulating layers to fill a gap between the semiconductor chip and the support plate, and effectively fix the semiconductor chip in the through cavity of the support plate. The second insulating layer also serves as a material required for a subsequent circuit fabrication process, such that material costs are saved, and a reliability problem due to chip contamination by flashes during an encapsulation process in conventional semiconductor packaging processes can be prevented, as well as a process stability problem such as a popcorn effect in a thermal cycle of a subsequent circuit stacking process caused by difficulty in effectively filling the gap between the semiconductor chip and the support plate by an encapsulating resin can be prevented.

The present invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a semiconductor package substrate with embedded chip, comprising the steps of:
   applying a first insulating layer on a surface of a metallic board, wherein the first insulating layer is formed with at least one opening for exposing a portion of the metallic board;
   providing at least one semiconductor chip having a plurality of electrode pads, and mounting the semiconductor chip on the portion of the metallic board exposed via the opening of the first insulating layer, wherein the semiconductor chip is mounted on the metallic board by a thermally conductive adhesive layer and the semiconductor chip is thicker than the first insulating layer;
   mounting a support plate on the first insulating layer, wherein the support plate is formed with a through cavity at a position corresponding to the opening of the first insulating layer, for receiving the semiconductor chip in the through cavity;
   applying a second insulating layer on the semiconductor chip and the support plate, and allowing insulating materials of the first and second insulating layers by heating pressing to bond together, and to fill a gap between the semiconductor chip and the support plate, wherein the second insulating layer and the first insulating layer are comprised of the same material; and
   performing a circuit patterning process to form a circuit layer on the second insulating layer applied on the semiconductor chip and the support plate so as to form conductive structures in the second insulating layer, such that the circuit layer is electrically connected to the electrode pads of the semiconductor chip by the conductive structures.

2. The fabrication method of claim 1, further comprising a step of performing a circuit build-up process to form a circuit build-up structure on the circuit layer and the second insulating layer.

3. The fabrication method of claim 2, further comprising a step of providing conductive elements on an outer surface of the circuit build-up structure, for electrically connecting the semiconductor chip to an external electronic device.

4. The fabrication method of claim 1, wherein the circuit patterning process comprises the steps of:
   forming openings in the second insulating layer to expose the electrode pads of the semiconductor chip;
   forming a conductive layer on the second insulating layer and the electrode pads exposed via the openings;
   applying a resist layer on the conductive layer, wherein the resist layer is formed with a plurality of openings for exposing portions of the conductive layer;
   performing an electroplating process to form the circuit layer and the conductive structures on the portions of the conductive layer exposed via the openings of the resist layer, such that the circuit layer on the second insulating layer is electrically connected to the electrode pads of the semiconductor chip by the conductive structures formed in the second insulating layer; and
   removing the resist layer and the conductive layer covered by the resist layer.

5. The fabrication method of claim 4, wherein the conductive layer is made of metal or a conductive polymer material.

6. The fabrication method of claim 1, wherein the conductive structures are conductive vias or conductive bumps.

7. The fabrication method of claim 1, wherein the first insulating layer when being applied on the metallic board has not been completely cured by baking.

8. The fabrication method of claim 1, wherein the metallic board is made of a copper film.

9. The fabrication method of claim 1, wherein the support plate is a circuit board, an insulating plate, or a metallic plate.

10. The fabrication method of claim 1, wherein the circuit layer is electrically connected to the support plate by conductive structures.

11. A semiconductor package substrate with embedded chip, comprising:
    a metallic board;
    a first insulating layer formed with at least one opening and applied on the metallic board;
    a support plate formed with a through cavity and mounted on the first insulating layer, wherein the through cavity of the support plate is formed at a position corresponding to the opening of the first insulating layer;
    at least one semiconductor chip having a plurality of electrode pads, the semiconductor chip being mounted on the metallic board and received in the opening of the first insulating layer and the through cavity of the support plate, wherein the semiconductor chip is mounted on the metallic board by a thermally conductive adhesive layer and the semiconductor chip is thicker than the first insulating layer;
    a second insulating layer applied on the semiconductor chip and the support plate, allowing insulating materials of the first and second insulating layers to fill a gap between the semiconductor chip and the support plate, wherein the second insulating layer and the first insulating layer are comprised of the same material; and
    at least one circuit layer formed on the second insulating layer, and electrically connected to the electrode pads of the semiconductor chip by a plurality of conductive structures.

12. The semiconductor package substrate of claim 11, further comprising at least one circuit build-up structure formed on the second insulating layer and the circuit layer.

13. The semiconductor package substrate of claim 12, further comprising conductive elements focused on an outer surface of the circuit build-up structure.

14. The semiconductor package substrate of claim 11, wherein the metallic board is made of a copper foil.

15. The semiconductor package substrate of claim 11, wherein the support plate is a circuit board, an insulating plate, or a metallic plate.

16. The semiconductor package substrate of claim 11, wherein the conductive structures are conductive vias or conductive bumps.

17. The semiconductor package substrate of claim 11, wherein the circuit layer is electrically connected to the support plate by conductive structures.

* * * * *